United States Patent
Chou et al.

(10) Patent No.: US 12,163,534 B1
(45) Date of Patent: Dec. 10, 2024

(54) FAN FIXING DEVICE FOR ELECTRONIC DEVICE

(71) Applicant: ASUSTEK COMPUTER INC., Taipei (TW)

(72) Inventors: Hsiang-An Chou, Taipei (TW); Jung-Fo Chin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 18/361,180

(22) Filed: Jul. 28, 2023

(30) Foreign Application Priority Data

May 16, 2023 (TW) .................................. 112118138

(51) Int. Cl.
*F04D 29/64* (2006.01)
*H05K 7/20* (2006.01)

(52) U.S. Cl.
CPC ....... *F04D 29/646* (2013.01); *H05K 7/20172* (2013.01)

(58) Field of Classification Search
CPC .......................... F04D 29/646; H05K 7/20172
See application file for complete search history.

(56) References Cited

U.S. PATENT DOCUMENTS

| | | | | |
|---|---|---|---|---|
| 6,592,327 B2 * | 7/2003 | Chen | ..................... | F04D 29/646 415/213.1 |
| 7,713,025 B2 * | 5/2010 | Chen | ..................... | F04D 29/601 415/214.1 |
| 7,839,638 B2 * | 11/2010 | Ye | ............................. | G06F 1/20 415/214.1 |
| 8,740,559 B2 * | 6/2014 | Wu | ..................... | F04D 25/0613 361/679.48 |
| 9,091,270 B2 * | 7/2015 | He | ........................ | F04D 29/526 |
| 10,746,195 B2 * | 8/2020 | Zhu | ....................... | F04D 29/646 |
| 2008/0101019 A1 * | 5/2008 | Tao | .................... | H05K 7/20727 361/695 |
| 2012/0027580 A1 * | 2/2012 | Lu | ...................... | F04D 25/0613 415/214.1 |

FOREIGN PATENT DOCUMENTS

| | | |
|---|---|---|
| CN | 2485466 Y | 4/2002 |
| CN | 202035248 U | 11/2009 |
| CN | 206097038 U | 4/2017 |
| TW | 201312009 A | 3/2013 |

* cited by examiner

*Primary Examiner* — David E Sosnowski
*Assistant Examiner* — Theodore C Ribadeneyra
(74) *Attorney, Agent, or Firm* — Muncy, Geissler, Olds & Lowe, P.C.

(57) ABSTRACT

A fan fixing device adapted to mount a fan in an electronic device is provided. The fan includes a frame, a first side plate, and a second side plate. The fan fixing device includes a fixing base and a fixing piece. The fixing base includes a side wall with an opening. The fixing piece is detachably mounted around the fan, and includes a main body with a first side, a second side, and a third side, a first fixing part, a second fixing part, and a buckling part. The first fixing part is fixed on the first side plate. The second fixing part is fixed on the second side plate. The buckling part is located on the third side, and includes an inner surface facing the frame and an outer surface clamped in the opening, to fix the fan on the fixing base.

10 Claims, 7 Drawing Sheets

FAN FIXING DEVICE FOR ELECTRONIC DEVICE

CROSS-REFERENCE TO RELATED APPLICATION

This application claims the priority benefit of Taiwan application serial No. 112118138, filed on May 16, 2023. The entirety of the above-mentioned patent application is hereby incorporated by reference herein and made a part of the specification.

BACKGROUND OF THE INVENTION

Field of the Invention

The disclosure relates to a fan fixing device, and in particular, to a fan fixing device for an electronic device.

Description of the Related Art

An electronic device (especially a server) often needs a heat dissipation fan to remove heat generated during operation.

Conventionally, fans are mostly fixed in a host chassis by screw locking. This fixing method requires disassembly and assembly with tools. However, with the more compact design of electronic devices, operators often face a problem of narrow operating space when disassembling and assembling fans, which increases maintenance time.

BRIEF SUMMARY OF THE INVENTION

The disclosure provides a fan fixing device, adapted to mount a fan in an electronic device. The fan includes a frame, a first side plate, and a second side plate. The first side plate and the second side plate are located on two opposite sides of the frame. The fan fixing device includes a fixing base and a fixing piece. The fixing base is arranged in the electronic device and includes a side wall with an opening. The fixing piece is detachably mounted around the fan, and includes a main body, a first fixing part, a second fixing part, and a buckling part. The main body includes a first side and a second side opposite to each other, and a third side. The third side is located between the first side and the second side. The first fixing part is located on the first side for being fixed on the first side plate. The second fixing part is located on the second side for being fixed on the second side plate. The buckling part is located on the third side, and includes an inner surface and an outer surface opposite to each other. The inner surface faces the frame and the outer surface is clamped in the opening, to fix the fan on the fixing base.

The fan fixing device provided in the disclosure includes the corresponding fixing base and fixing piece. The fixing base is arranged in the electronic device and the fixing piece is mounted outside the fan. Through the clamping connection between the fixing piece and the fixing base, the fan is fixed on the fixing base without tools, which is helpful to improve the problem of narrow operating space and increased maintenance time faced during conventional disassembly and assembly of the fan.

DETAILED DESCRIPTION OF THE EMBODIMENTS

Specific implementations of the disclosure are described in more detail with reference to the drawings. Advantages and features of the disclosure are clearer according to the following descriptions and claims. It is to be noted that, the drawings adopt a very simplified form and use a non-precise proportion, and are merely used for conveniently and clearly assisting in describing the objective of the embodiments of the disclosure.

Figure 1:
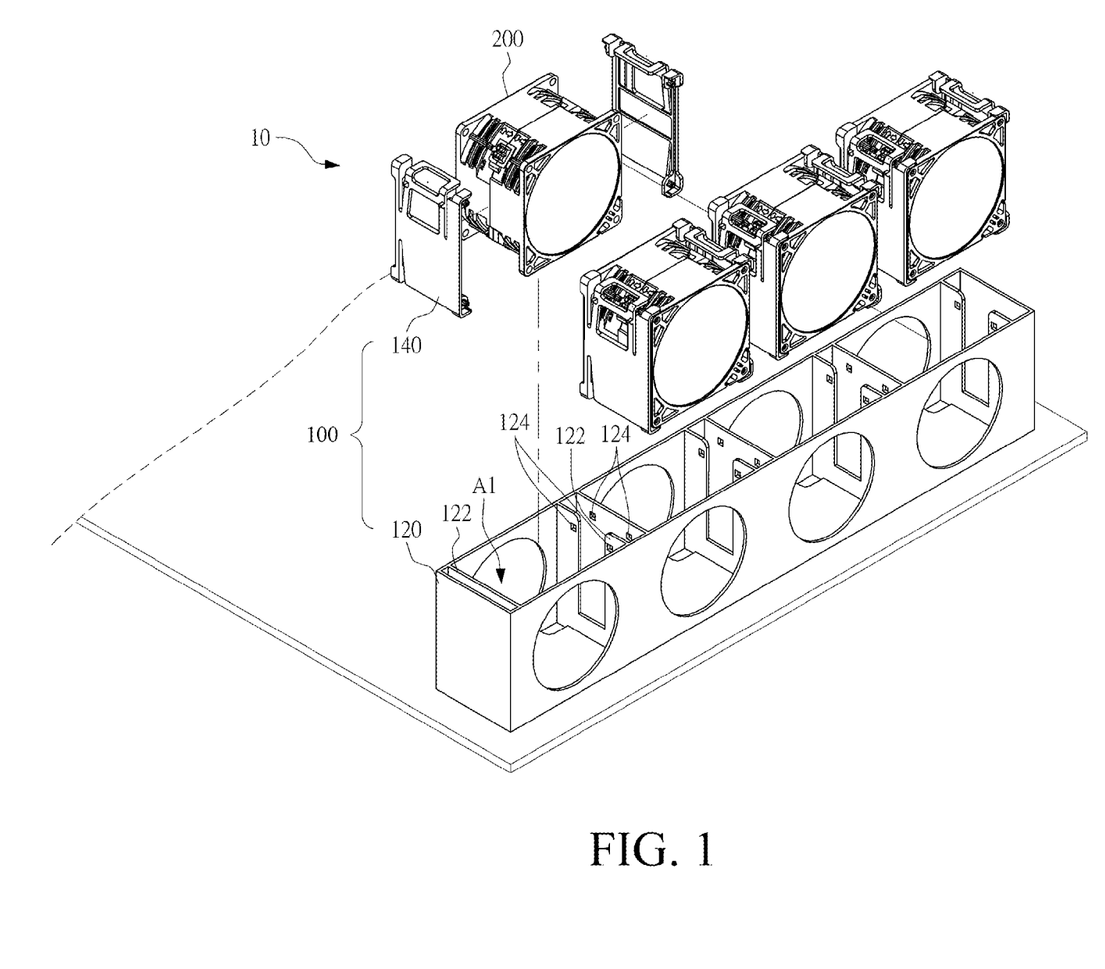
FIG. 1 is a three-dimensional schematic diagram of a fan fixing device and a mounted fan according to an embodiment of the disclosure.
Figure 2:
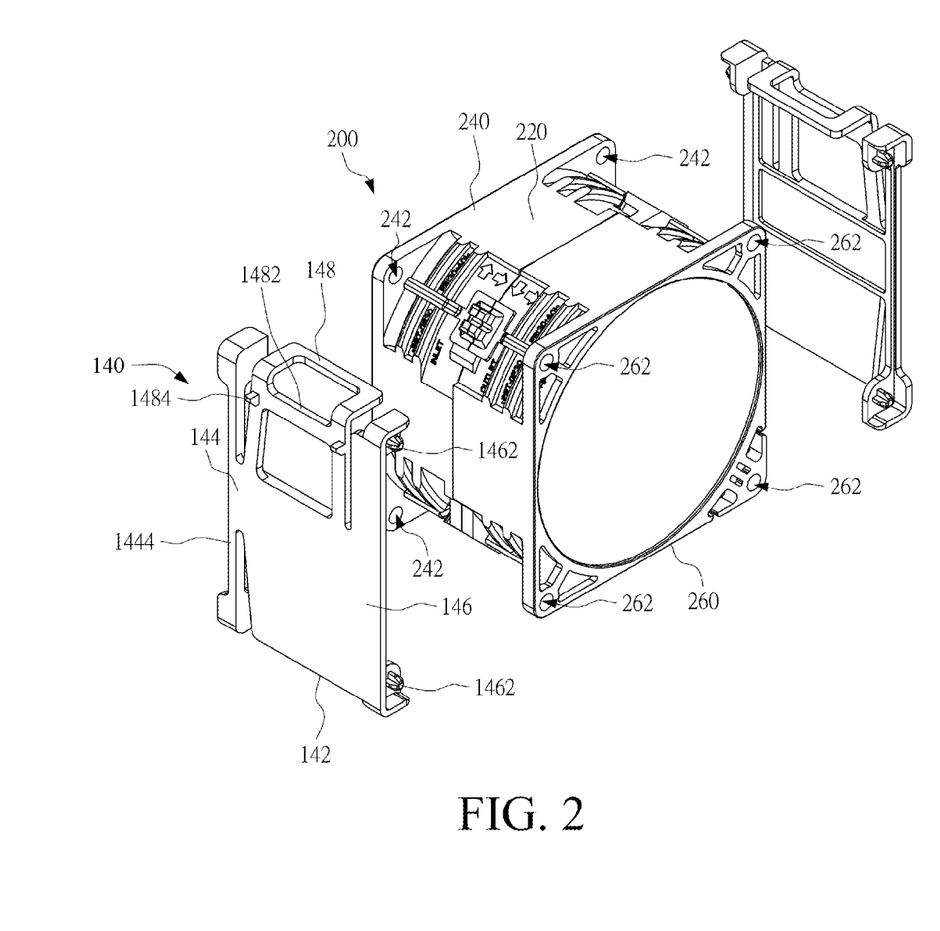
FIG. 2 shows the fan and a fixing piece mounted on the fan in FIG. 1 in an enlarged view.

FIG. 1 is a three-dimensional schematic diagram of a fan fixing device 100 and a mounted fan 200 according to an embodiment of the disclosure. FIG. 2 shows the fan 200 and a fixing piece 140 mounted on the fan 200 in FIG. 1 in an enlarged view.

The fan fixing device 100 is adapted to mount a fan 200 in an electronic device 10, such as a computer host or a server. The fan 200 is an axial fan commonly used in the electronic device 10.

As shown in the figure, the fan 200 includes a frame 220, a first side plate 240, and a second side plate 260. The first side plate 240 and the second side plate 260 are located on two opposite sides of the frame 220. The first side plate 240 is square and provided with four first holes 242, and the second side plate 260 is square and provided with four second holes 262. The four first holes 242 are located at four corners of the first side plate 240. The four second holes 262 are located at four corners of the second side plate 260 and are aligned with the corresponding first holes 242 respectively. In a conventional fan mounting procedure, the first hole 242 and the second hole 262 are as screw locking holes for fixing.

The fan fixing device 100 in the disclosure includes a fixing base 120 and at least one fixing piece 140. In the fan fixing device 100 in this embodiment, the first hole 242 and the second hole 262 of the fan 200 are used as fixing structures to fix the fixing piece 140 on the fan 200, and then a combination of the fixing piece 140 and the fixing base 120 is used to mount the fan 200 in the electronic device.

The fixing base 120 is arranged in a chassis of the electronic device. As shown in the figure, the fixing base 120 includes a plurality of accommodating spaces A1 (only one of which is marked in the figure) for accommodating the fans 200 respectively. A side surface of each accommodating space A1 includes at least one side wall 122, and the side wall 122 is provided with at least one opening 124. Using the fixing base 120 in the figure as an example, the fixing base 120 includes four accommodating spaces A1 for mounting up to four fans 200. Each accommodating space A1 includes two side walls 122, and each side wall 122 is provided with two openings 124.

The fixing piece 140 is detachably mounted around the frame 220 of the fan 200. A width of the fixing piece 140 approximately corresponds to a thickness of the fan 200. In an embodiment, each fan 200 corresponds to two fixing pieces 140. The two fixing pieces 140 are mounted on two opposite sides of the frame 220 of the fan 200, and are clamped and fixed on the side walls 122 on two opposite sides of the accommodating space A1, to mount the fan 200 in the accommodating space A1. In other embodiments, the fixing piece 140 is mounted only on one side of the fan 200 to reduce costs.

Figure 3:
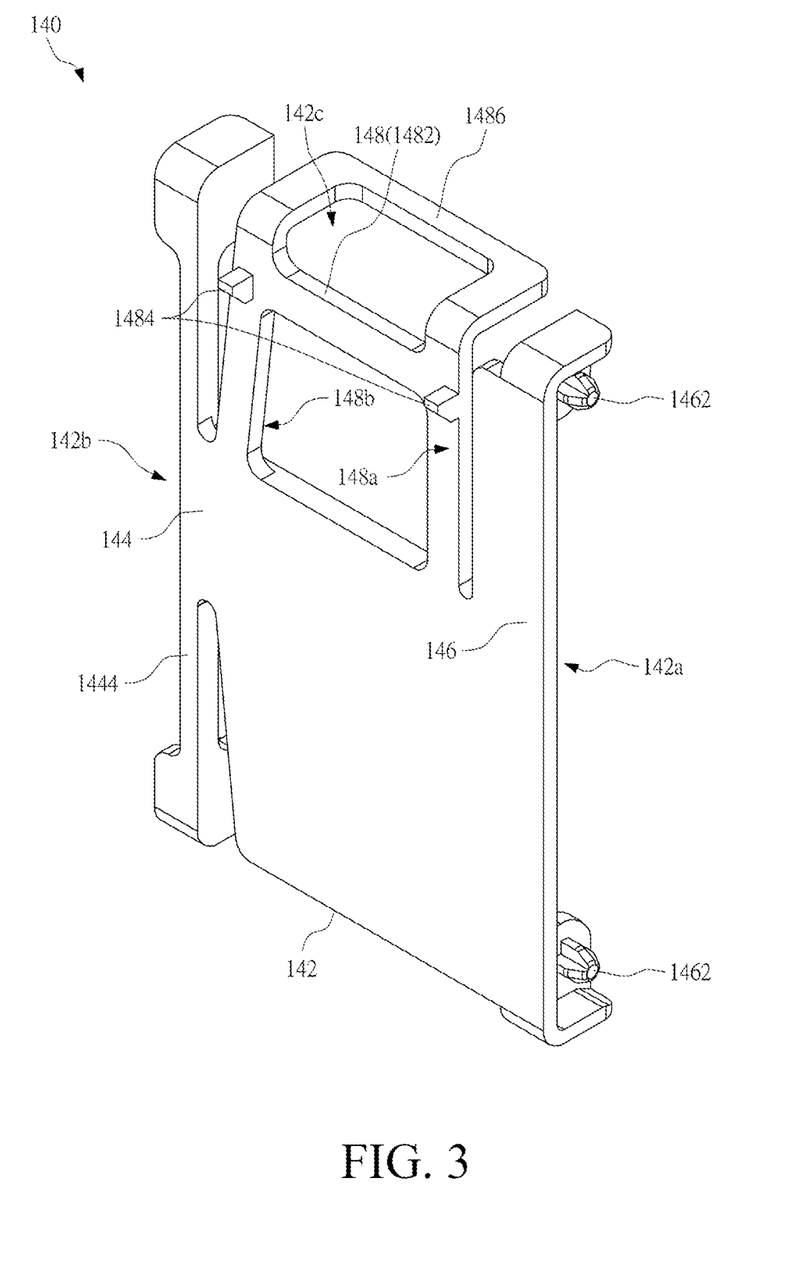
FIG. 3 shows the fixing piece in FIG. 1 in an enlarged view.
Figure 4:
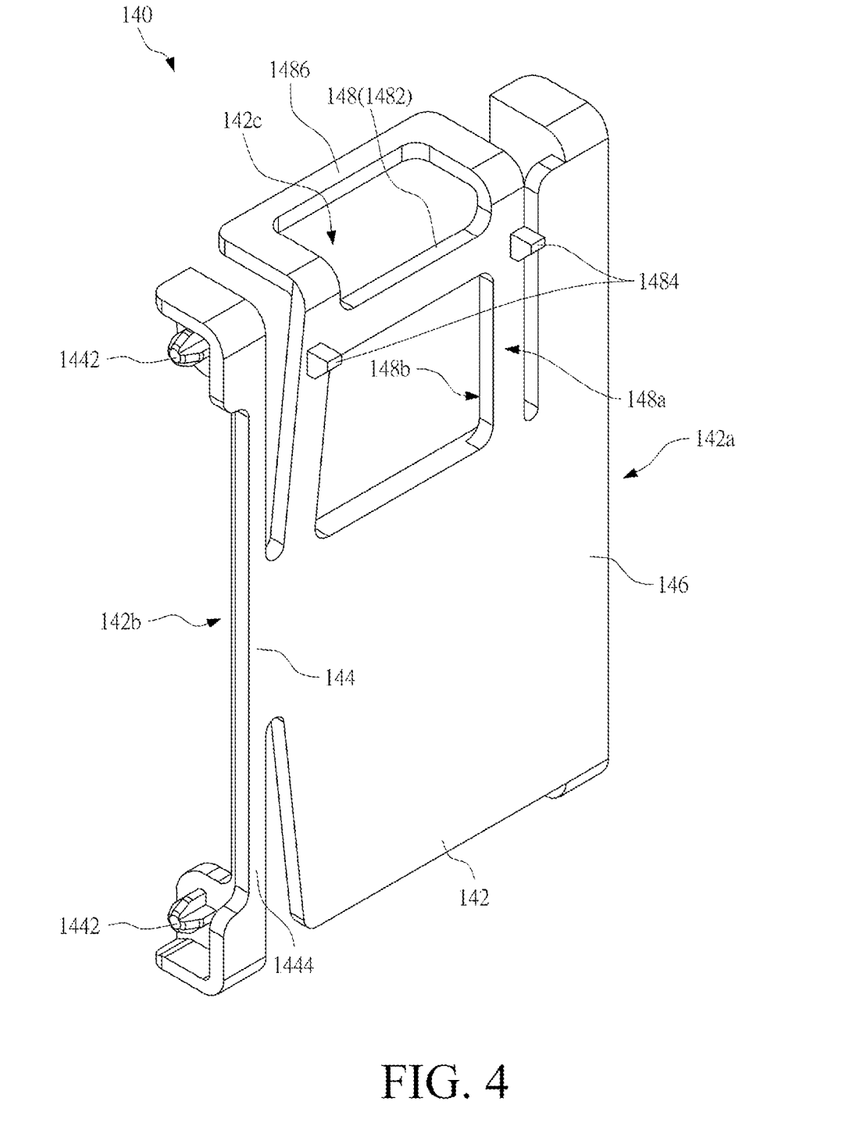
FIG. 4 is a schematic diagram of the fixing piece in FIG. 3 corresponding to another viewing angle.

Referring to FIG. 3 and FIG. 4 together, FIG. 3 shows the fixing piece in FIG. 1 in an enlarged view, and FIG. 4 is a schematic view of the fixing piece 140 in FIG. 3 corresponding to another viewing angle. As shown in the figure, the fixing piece 140 includes a main body 142, a first fixing part 144, a second fixing part 146, and a buckling part 148.

The main body 142 includes a first side 142a and a second side 142b opposite to each other, and a third side 142c. The third side 142c is located between the first side 142a and the second side 142b. The first fixing part 144 is located on the first side 142a for being fixed on the first side plate 240. The second fixing part 146 is located on the second side 142b for being fixed on the second side plate 260. The buckling part 148 is located on the third side 142c and includes an inner surface 148a and an outer surface 148b opposite to each other. During mounting, the inner surface 148a of the buckling part 148 faces the frame 220, and the outer surface 148b is clamped in the opening 124, to fix the fan 200 on the fixing base 120.

In this embodiment, the first hole 242 and the second hole 262 of the fan 200 are used to fix the fixing piece 140 on the fan 200. Specifically, as shown in the figure, the first fixing part 144 includes two first bumps 1442 for being inserted into and positioned in two adjacent first holes 242 or second holes 262, and the second fixing part 146 includes two second bumps 1462 for being inserted into and positioned in two adjacent second holes 262 or first holes 242. Sizes of the first bump 1442 and the second bump 1462 correspond to sizes of the first hole 242 and the second hole 262. In this way, the fixing piece 140 is mounted outside the frame 220 of the fan 200.

In an embodiment, to facilitate disassembly and assembly of the fixing piece 140, the first fixing part 144 in this embodiment includes two elastic ribs 1444 (only one of which is marked in the figure). The two elastic ribs 1444 obliquely extend from the main body 142 towards a direction opposite to the second fixing part 146. The two first bumps 1442 are respectively arranged at one end of the two elastic ribs 1444 away from the main body 142, and the first bump 1442 and the second bump 1462 protrude approximately in opposite directions.

The buckling part 148 includes an elastic structure 1482 and at least one buckle 1484 (two buckles 1484 are shown in the figure for illustration). One end of the elastic structure 1482 is connected to the main body 142, and an other end of the elastic structure 1482 includes a pressing part 1486. The buckle 1484 is arranged at one side of the elastic structure 1482 to be buckled on the opening 124 on the side wall 122. When the fixing piece 140 is mounted on the fan 200, the buckle 1484 is located on one side of the elastic structure 1482 opposite to the frame 220.

It is to be noted that since the first side plate 240 and the second side plate 260 of the fan 200 are symmetrically arranged at a front side and a rear side of the fan 200, the fixing piece 140 provided in the disclosure changes its mounting direction according to actual requirements. Referring to FIG. 2 again, the pressing parts 1486 of the fixing pieces 140 mounted on the two sides of the fan 200 are all oriented upward to facilitate user operation. However, the two fixing pieces 140 are mounted in opposite directions with respect to the fan 200. The first fixing part 144 of the fixing piece 140 located on the left side of the figure faces the second side plate 260 of the fan 200, and the first fixing part 144 of the fixing piece 140 located on the right side of the figure faces the first side plate 240 of the fan 200.

Figure 5:
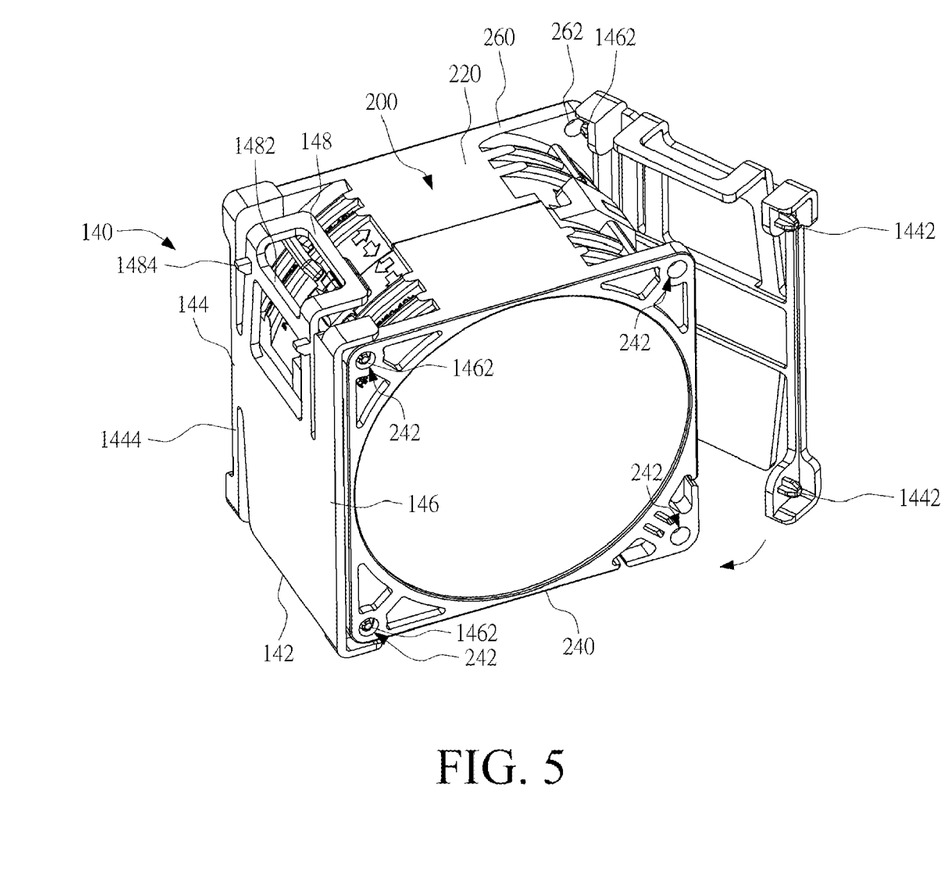
FIG. 5 to FIG. 7 show operation steps of mounting a fan by using the fan fixing device in the disclosure.
Figure 6:
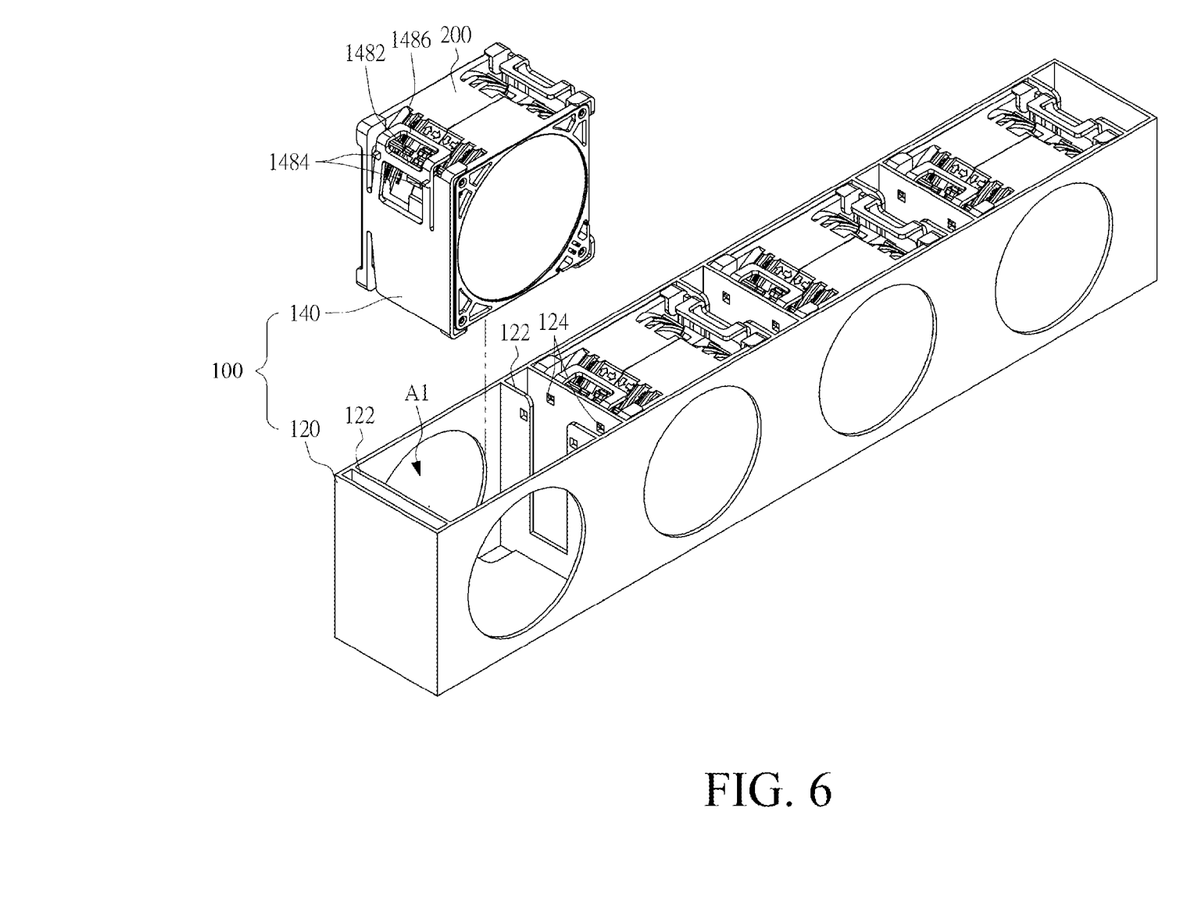
Figure 7:
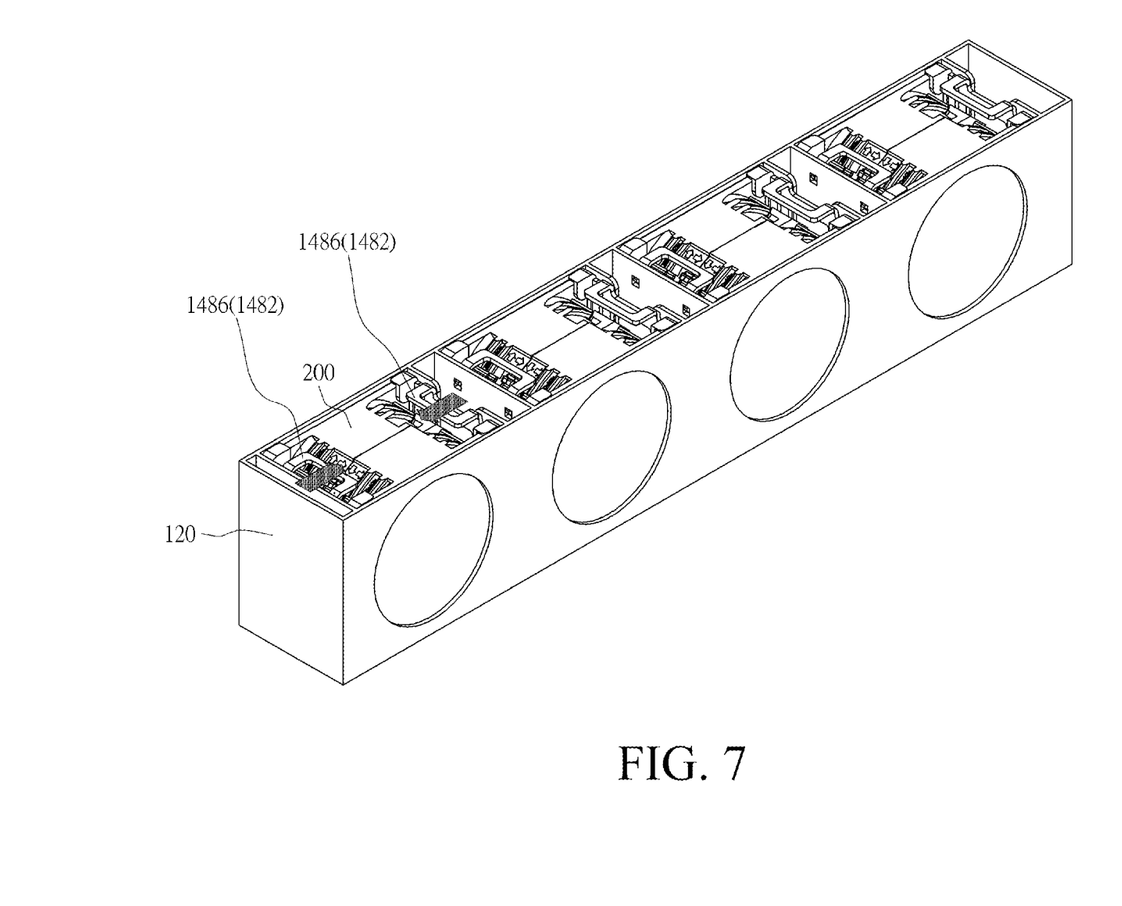

FIG. 5 to FIG. 7 show operation steps of mounting the fan 200 by using the fan fixing device 100 of the disclosure.

First, as shown in FIG. 5, a user first mounts the second bump 1462 in the second hole 262 and then applies a force in a direction of arrow in the figure. In this case, the elastic ribs 1444 are retracted by the force to facilitate the insertion of the first bump 1442 into the corresponding first hole 242, to fix the fixing piece 140 on the outside of the frame 220. It is to be noted that since the fan 200 presents a symmetrical shape, the user first mounts the second bump 1462 in the first hole 242, and then applies a force to mount the first bump 1442 in the second hole 262.

Subsequently, as shown in FIG. 6, the user places the fans 200 on which the fixing piece 140 is mounted in the accommodating spaces A1 of the fixing base 120 from top to bottom. In this case, the buckle 1484 of the buckling part 148 is clamped in the opening 124 of the side wall 122 of the fixing base 120, to fix the fans 200 in the accommodating spaces A1.

As shown by an arrow in FIG. 7, in order to take out the fan 200, the user presses the pressing part 1486 from the upper part of the fixing base 120 in a direction of arrow in FIG. 7, to disengage the buckle 1484 on the elastic structure 1482 from the opening 124. Then the fan 200 is taken out.

Since the fixing piece 140 in the disclosure is located in a space formed by an edge of the first side plate 240, an edge of the second side plate 260, and the frame 220, the fixing piece 140 in the disclosure does not occupy an additional space, and the operation of the buckling part 148 is directly performed above the fan 200 without a large operating space.

The fan fixing device 100 provided in the disclosure includes the corresponding fixing base 120 and fixing piece 140. The fixing base 120 is arranged in the electronic device, and the fixing piece 140 is mounted outside the fan 200. Through the clamping connection between the fixing piece 140 and the fixing base 120, the fan 200 is fixed on the fixing base 120 without tools, which is helpful to improve the problem of narrow operating space and increased maintenance time faced during conventional disassembly and assembly of the fan 200.

The above descriptions are merely exemplary embodiments of the disclosure and do not limit the disclosure. Variations such as equivalent replacements or modifications in any form made by any person skilled in the art to the technical means and technical content disclosed in the disclosure without departing from the technical means of the disclosure are content not departing from the technical means of the disclosure and still fall within the protection scope of the disclosure.

What is claimed is:

1. A fan fixing device, adapted to mount a fan in an electronic device, wherein the fan comprises a frame, a first side plate, and a second side plate, the first side plate and the second side plate are located on two opposite sides of the frame, and the fan fixing device comprises:
   a fixing base, arranged in the electronic device, and comprising a side wall with an opening; and
   a fixing piece, detachably mounted around the fan, and comprising:
   a main body, comprising a first side and a second side opposite to each other, and a third side, wherein the third side is located between the first side and the second side;

a first fixing part, located on the first side for being fixed on the first side plate;

a second fixing part, located on the second side for being fixed on the second side plate; and a buckling part, located on the third side, and comprising an inner surface and an outer surface opposite to each other, wherein the inner surface faces the frame and the outer surface is clamped in the opening, to fix the fan on the fixing base, wherein the first side plate is square and provided with four first holes, the second side plate is square and provided with four second holes, the first fixing part comprises two first bumps for being inserted into two adjacent first holes, and the second fixing part comprises two second bumps for being inserted into two adjacent second holes, and wherein the first fixing part comprises two elastic ribs, the two elastic ribs obliquely extend from the main body towards a direction opposite to the second fixing part, and the two first bumps are respectively arranged at one end of the two elastic ribs away from the main body.

2. The fan fixing device according to claim 1, wherein the first bump and the second bump protrude in opposite directions.

3. The fan fixing device according to claim 1, wherein the four first holes are located at four corners of the first side plate.

4. The fan fixing device according to claim 3, wherein the first hole is a locking hole.

5. The fan fixing device according to claim 1, wherein the four second holes are located at four corners of the second side plate.

6. The fan fixing device according to claim 5, wherein the second hole is a locking hole.

7. The fan fixing device according to claim 1, wherein the buckling part comprises an elastic structure and a buckle, one end of the elastic structure is connected to the main body, an other end of the elastic structure comprises a pressing part, and the buckle is arranged on one side of the elastic structure opposite to the frame.

8. The fan fixing device according to claim 1, wherein a width of the fixing piece corresponds to a thickness of the fan.

9. The fan fixing device according to claim 1, wherein two fixing pieces are provided, for being detachably mounted on two opposite sides of the frame.

10. The fan fixing device according to claim 1, wherein two side walls are provided, and the two side walls are located on two opposite sides of the fixing base.

* * * * *